United States Patent
Durham et al.

(10) Patent No.: US 8,010,932 B2
(45) Date of Patent: Aug. 30, 2011

(54) STRUCTURE FOR AUTOMATED TRANSISTOR TUNING IN AN INTEGRATED CIRCUIT DESIGN

(75) Inventors: Christopher M. Durham, Round Rock, TX (US); Peter J. Klim, Austin, TX (US); Robert N. L. Krentler, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 559 days.

(21) Appl. No.: 12/130,476

(22) Filed: May 30, 2008

(65) Prior Publication Data
US 2008/0229260 A1      Sep. 18, 2008

Related U.S. Application Data

(63) Continuation-in-part of application No. 11/457,332, filed on Jul. 13, 2006, now abandoned.

(51) Int. Cl.
*G06F 9/455* (2006.01)
(52) U.S. Cl. ........ 716/133; 716/113; 716/132; 716/134; 716/135; 703/19
(58) Field of Classification Search .............. 716/5–6, 716/132–135, 108, 109, 113; 703/19
See application file for complete search history.

(56) References Cited

U.S. PATENT DOCUMENTS

| | | | |
|---|---|---|---|
| 6,209,122 B1 * | 3/2001 | Jyu et al. | 716/6 |
| 6,735,543 B2 * | 5/2004 | Douskey et al. | 702/120 |
| 6,766,505 B1 * | 7/2004 | Rangan et al. | 716/16 |
| 7,278,122 B2 * | 10/2007 | Willis | 716/3 |
| 7,302,657 B2 * | 11/2007 | Lindkvist | 716/6 |

OTHER PUBLICATIONS

Chung et al.; "Optimization of Power Dissipation and Skew Sensitivity in Clock Buffer Synthesis"; Proceedings of the 1995 International Symposium on Low Power Design Table of Content, Dana Point, CA; pp. 79-184; 1995.
Liu et al.; "Delay Constrained Optimization by Simultaneous Fanout Tree Construction, Buffer Insertion/Sizing and Gate Sizing"; 2000 IEEE' pp. 209-214.

* cited by examiner

*Primary Examiner* — Paul Dinh
*Assistant Examiner* — Nha T Nguyen
(74) *Attorney, Agent, or Firm* — Dillon & Yudell LLP

(57) ABSTRACT

A design structure for tuning an integrated circuit design holds a reference clock signal constant across the integrated circuit design and, while the reference clock signal is held constant, optimizes transistors forming a register within the integrated circuit design and thereafter optimizes transistors forming one or more clock buffers coupled to the reference clock signal.

9 Claims, 7 Drawing Sheets

STRUCTURE FOR AUTOMATED TRANSISTOR TUNING IN AN INTEGRATED CIRCUIT DESIGN

The present application is a continuation-in part of U.S. patent application Ser. No. 11/457,332, filed Jul. 13, 2006. Applicants hereby claim benefit of priority under 35 U.S.C. 120 to U.S. patent application Ser. No. 11/457,332, which is incorporated by reference herein in its entirety and for all purposes.

BACKGROUND OF THE INVENTION

1. Technical Field

The present invention relates in general to a design structure, and more specifically to a design structure for tuning transistors in an integrated circuit design.

2. Description of the Related Art

The design of modern digital integrated circuits, which contain millions of transistors, is a complex task. One of the important design steps is optimization, also referred to as circuit tuning. In the tuning step, the optimal size of each transistor in the circuit is determined. Wider transistors are generally capable of handling increased electrical current, which leads to faster circuits and greater power dissipation. However, wider transistors also consume more physical area and place a heavier burden on the previous stage of logic. Determining the optimal size for each transistor yields tremendous benefits, but since an optimal size must be calculated for each individual transistor, the task can be very complex and time consuming.

Traditional optimization of electronic circuits is a manual, iterative, tedious, and error-prone task. In contrast, automated tuning, which utilizes software implementing sophisticated numerical algorithms, improves performance and increases designer productivity. Static circuit optimization implies the determination of optimal transistor and wire sizes, on a static timing basis, while simultaneously taking into account all paths through the logic. The advantages of static optimization include increased designer productivity, since an optimal circuit is automatically determined; higher quality circuits, e.g. faster, smaller, and/or lower power consumption; and the fact that all possible paths through the logic are simultaneously considered.

Current automated transistor tuning tools, such as IBM's EinsTuner™, play a key role in the circuit design process. Automated transistor tuning tools take many constraints, such as robustness, speed, timing constraints, area, input loading, and rise and fall time limits, into account to render practical tuning results. However, current automated transistor tuning tools do have limitations. Specifically, register components are not tunable by transistor-level tuning tools. This limitation is due to the inclusion of local clock buffers, also known as LCBs, inside the macro paths (i.e., schematics) and the register flip-flop and latch cells of electronic circuits. Local clock buffers are typically designed using components from standard libraries that comply with specific loading rules in order to ensure a common clock arrival and clock skew reference among all registers in the circuit. If clock arrival times are not consistent among all registers, problems (e.g., early and late timing) will arise during the operation of the circuit. Consequently, the present invention recognizes that a method and system for tuning register components and optimizing local clock buffers would be a welcome improvement.

SUMMARY OF THE INVENTION

A design structure for tuning an integrated circuit design holds a reference clock signal constant across the integrated circuit design and, while the reference clock signal is held constant, optimizes transistors forming a register within the integrated circuit design and thereafter optimizes transistors forming one or more clock buffers coupled to the reference clock signal.

The above as well as additional objectives, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The present invention provides a method, system, computer program product and design structure for tuning register components and optimizing local clock buffers in electronic circuit designs in order to enhance power efficiency and optimize component sizes.

Figure 1:
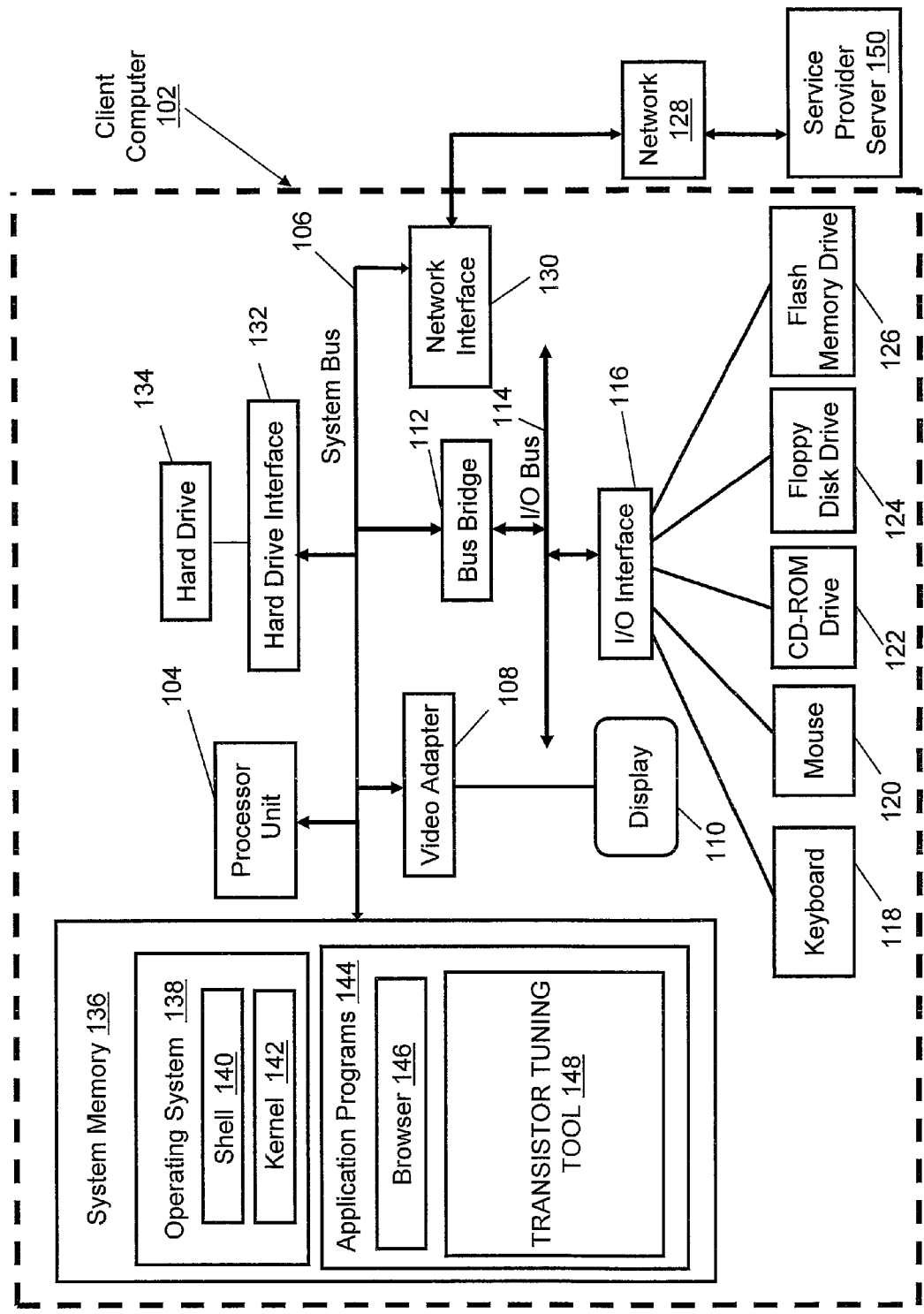
FIG. 1 depicts a high level block diagram of an exemplary data processing system, as utilized in an embodiment of the present invention.

With reference now to FIG. 1, there is depicted a block diagram of an exemplary client computer 102, with which the present invention may be utilized. Client computer 102 includes a processor unit 104 that is coupled to a system bus 106. A video adapter 108, which drives/supports a display 110, is also coupled to system bus 106. System bus 106 is coupled via a bus bridge 112 to an Input/Output (I/O) bus 114. An I/O interface 116 is coupled to I/O bus 114. I/O interface 116 affords communication with various I/O devices, including a keyboard 118, a mouse 120, a Compact Disk-Read Only Memory (CD-ROM) drive 122, a floppy disk drive 124, and a flash drive memory 126. The format of the ports connected to I/O interface 116 may be any known to those skilled in the art of computer architecture, including but not limited to Universal Serial Bus (USB) ports.

Client computer 102 is able to communicate with a service provider server 202 via a network 128 using a network interface 130, which is coupled to system bus 106. Network 128 may be an external network such as the Internet, or an internal network such as an Ethernet or a Virtual Private Network (VPN). Using network 128, client computer 102 is able to use the present invention to access service provider server 150.

A hard drive interface 132 is also coupled to system bus 106. Hard drive interface 132 interfaces with a hard drive 134. In a preferred embodiment, hard drive 134 populates a system memory 136, which is also coupled to system bus 106. Data that populates system memory 136 includes client computer 102's operating system (OS) 138 and application programs 144.

OS 138 includes a shell 140, for providing transparent user access to resources such as application programs 144. Generally, shell 140 is a program that provides an interpreter and an interface between the user and the operating system. More specifically, shell 140 executes commands that are entered into a command line user interface or from a file. Thus, shell 140 (as it is called in UNIX®), also called a command processor in Windows®, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 142) for processing. Note that while shell 140 is a text-based, line-oriented user interface, the present invention will equally well support other user interface modes, such as graphical, voice, gestural, etc.

As depicted, OS 138 also includes kernel 142, which includes lower levels of functionality for OS 138, including providing essential services required by other parts of OS 138 and application programs 144, including memory management, process and task management, disk management, and mouse and keyboard management.

Application programs 144 include a browser 146. Browser 146 includes program modules and instructions enabling a World Wide Web (WWW) client (i.e., client computer 102) to send and receive network messages to the Internet using HyperText Transfer Protocol (HTTP) messaging, thus enabling communication with service provider server 150.

Application programs 144 in system memory 136 also include transistor tuning tool 148. Although illustrated as a single component, in some embodiments transistor tuning tool 148 may be formed of multiple software components. As described further below, transistor tuning tool 148 may be utilized to implement the process depicted in FIG. 5 wholly or in part. In one embodiment, client computer 102 is able to download transistor tuning tool 148 from service provider server 150 shown in FIG. 1, for example, via browser 146. In another embodiment, client computer 102 accesses transistor tuning tool 148 via browser 146. An example of transistor tuning tool 148 that may be utilized in the present invention include EinsTuner, available from IBM Corporation of Armonk, N.Y.

The hardware elements depicted in client computer 102 are not intended to be exhaustive, but rather are representative to highlight certain components that mat be utilized to practice the present invention. For instance, client computer 102 may include alternate memory storage devices such as magnetic cassettes, Digital Versatile Disks (DVDs), Bernoulli cartridges, and the like. These and other variations are intended to be within the spirit and scope of the present invention.

Figure 2:
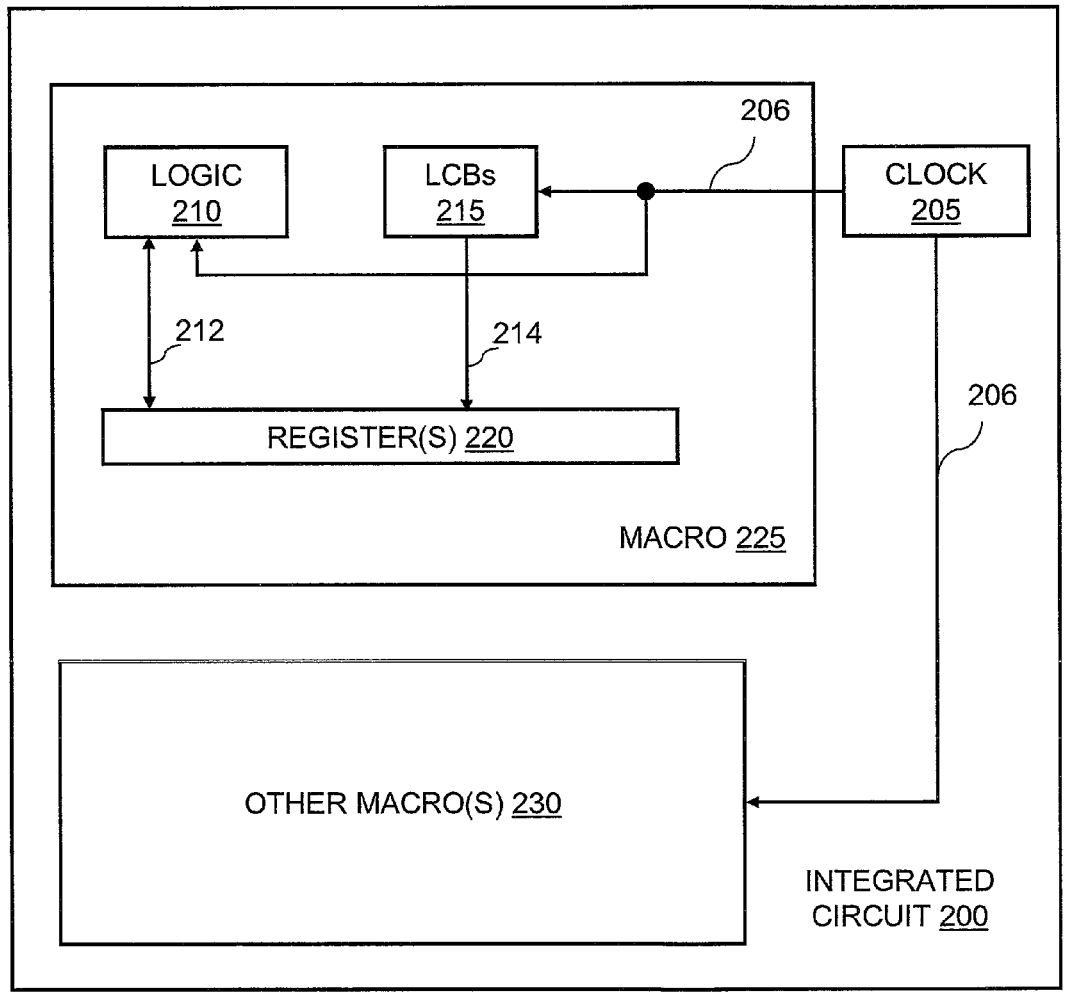
FIG. 2 illustrates a high level block diagram of an integrated circuit design undergoing optimization in accordance with an embodiment of the present invention.

With reference now to FIG. 2, there is depicted a high level block diagram of an exemplary integrated circuit 200 whose design may be tuned by transistor tuning tool 148 in accordance with the present invention. Integrated circuit 200 comprises a substrate (e.g., Si) on which are formed integrated circuitry including a macro 225, one or more other macros 230, and a clock circuit 205 that generates a reference clock signal 206 distributed to macros 225, 230 in order to coordinate their operation. Macro 225 in turn comprises logic 210 for performing one or more desired logical functions, a plurality of local clock buffers (LCBs) 215, and one or more registers 220 that, in response to a local clock signal 214 provided by an LCB 215, buffers data received from logic 210 via functional signals 212.

Figure 3A:
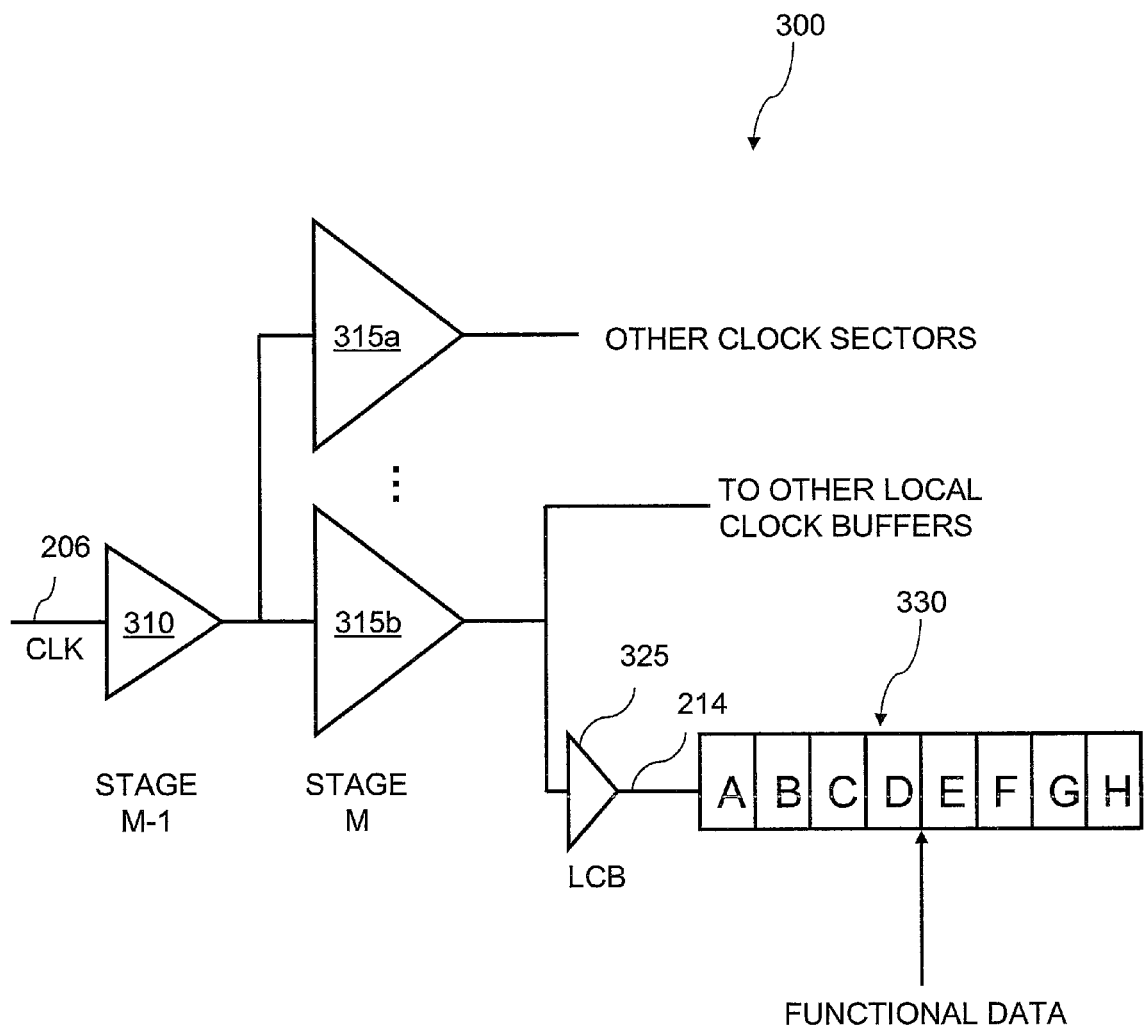
FIG. 3A is a schematic diagram of clock buffers and registers within an integrated circuit design prior to the transistor tuning process according to one embodiment of the invention.

Turning now to FIG. 3A, there is depicted a more detailed block diagram of a typical circuit 300 within macro 225 that contains a local clock buffer (LCB) 325 and register 330. Circuit 300 comprises a portion of a multi-stage clock buffer tree, including an M-1 stage clock buffer 310 and two $M^{th}$ stage clock buffers 315a, 315b. M-1 stage clock buffer 310 receives the reference clock signal 206 as an input and distributes the reference clock to $M^{th}$ stage clock buffers 315a, 315b. $M^{th}$ stage clock buffer 315a distributes reference clock signal 206 to other clock sectors, while $M^{th}$ stage clock buffer 315b distributes reference clock signal to one or more LCBs, including LCB 325 coupled to provide a local clock signal 214 to synchronize the operation of register 330. Register 330 comprises 8 individual bits, labeled A through H.

While circuit 300 is shown having a single M-1 stage clock buffer 310, circuit 300 may instead have a plurality of M-1 stage clock buffers 310. Similarly, while FIG. 3A depicts both M-1 stage clock buffer 310 and $M^{th}$ stage clock buffers 315, circuit 300 may instead have only $M^{th}$ stage clock buffers 315. In yet another embodiment, circuit 300 may comprise one or more stages of clock buffers preceding M-1 stage clock buffer 310, e.g. M-2 stage clock buffer(s).

Figure 3B:
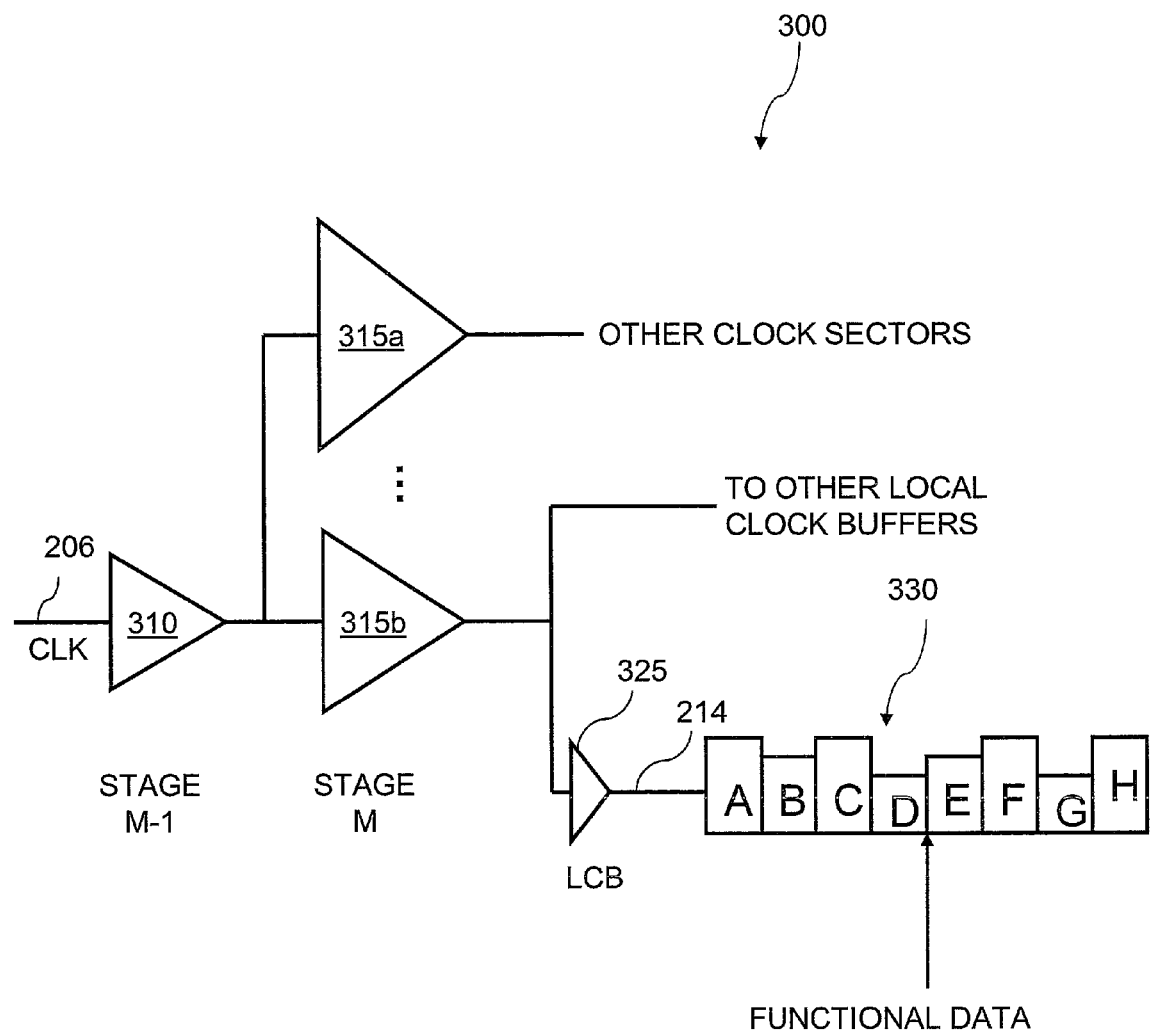
FIG. 3B is a schematic diagram of clock buffers and registers within an integrated circuit design after the transistor tuning process according to one embodiment of the invention.

As can be seen by comparison of FIG. 3B with FIG. 3A, after the design of integrated circuit 200 has been tuned in accordance with the present invention, the size of the transistors comprising each of bits A through H may differ according to the specific power, area, and timing requirements of integrated circuit 200. Consequently, different ones of register bits A-H may have different resulting sizes. In addition, individual clock buffers, such as LCB 325, $M^{th}$ stage clock buffers 315a, 315b, and/or M-1 stage clock buffer 310 may also be resized (e.g., reduced in size) after tuning as a result of the redefined attributes of bits A through H within register 330.

Figure 4:
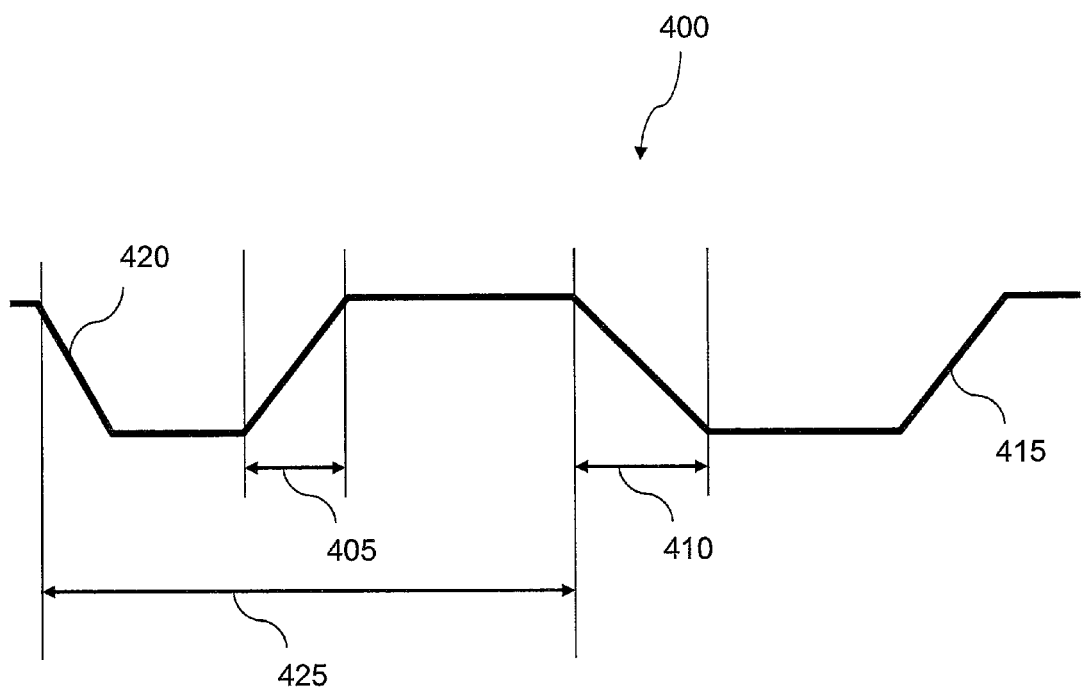
FIG. 4 illustrates a generic clock waveform, including rising edge time, falling edge time, rising edge slew, and falling edge slew, as used in an embodiment of the present invention.

With reference now to FIG. 4, there is depicted a generic waveform 400 of clock reference signal 206 in accordance with the present invention. As depicted, waveform 400 exhibits an oscillation between a minimum voltage and a maximum voltage over a fixed period 425. Waveform 400 may be characterized by at least four additional factors: rising edge time 405, falling edge time 410, a rising edge slew rate, and falling edge slew rate. As depicted, rising edge time 405 is defined as the time required for waveform 400 to transition from its minimum voltage to its maximum voltage. Falling edge time 410 is similarly defined as the time required for waveform 400 to transition from its peak voltage to its minimum voltage. Rising edge slew rate is defined as the maximum rate of change in voltage of waveform 400 in its rising edge 415. Similarly, falling edge slew rate is defined as the maximum rate of decrease in the voltage of waveform 400 in its falling edge 420. The present invention utilizes pattern matching and/or name recognition to ensure that all four factors (i.e., rising edge time 405, falling edge time 410, rising edge slew rate, and falling edge slew rate) that characterize waveform 400 are held constant during the automated tuning of registers 220 as described further below.

Figure 5:
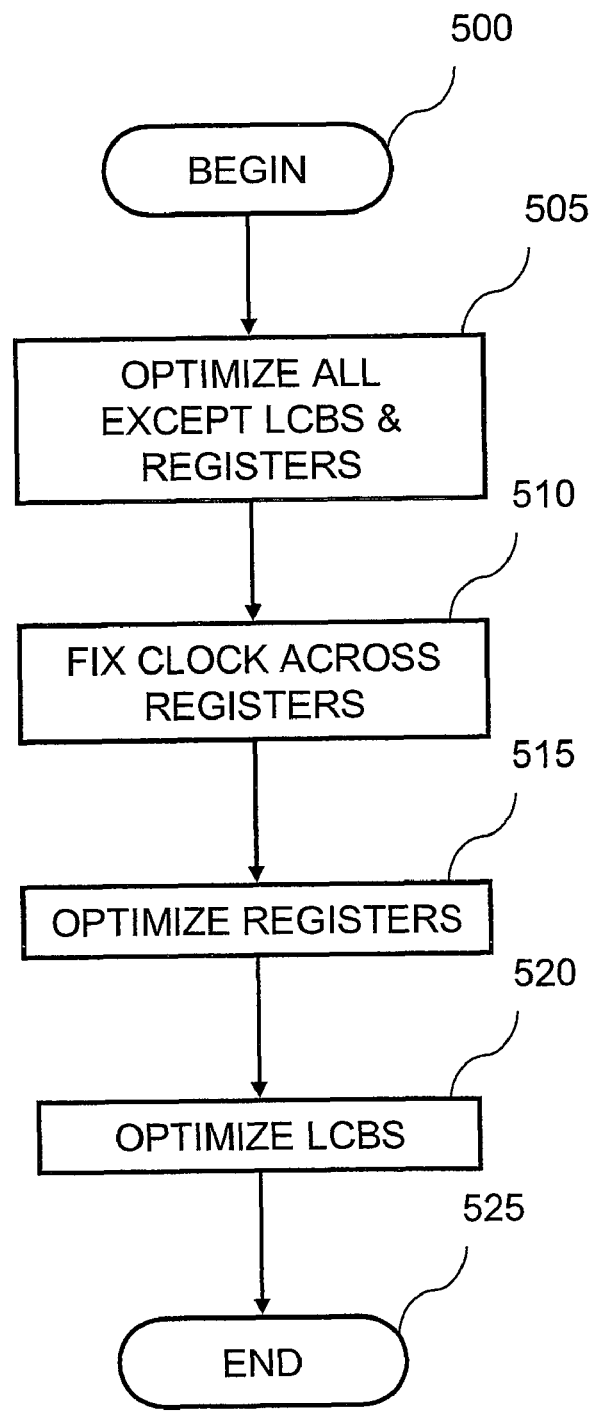
FIG. 5 is a high level logical flowchart of an exemplary method of transistor tuning in accordance with one embodiment of the invention.

Turning now to FIG. 5, there is depicted a high level logical flowchart of an exemplary method of transistor tuning in accordance with one embodiment of the invention. According to this method, the characteristics of reference clock signal 206 are held constant during tuning of registers 220. The depicted method can be performed, for example, by transistor tuning tool 148.

The transistor tuning process begins at block 500, for example, in response to a user of computer 102 invoking transistor tuning tool 148, which preferably performs the remainder of the illustrated steps in an automated manner. At block 505, transistor tuning tool 148 optimizes all transistors within the design of integrated circuit 200 except those that implement LCBs 215, such as LCB 325, and registers 220, such as register 330. For example, transistor tuning tool 148 optimizes the transistors forming logic 210. Next, at block 510, transistor tuning tool 148 holds the waveform 400 of reference clock signal 206 constant across the design of integrated circuit 200 via the utilization of pattern matching and/or name recognition. As noted above, the four principle factors (i.e., rising edge time 405, falling edge time 410, rising edge slew rate, and falling edge slew rate) that characterize waveform 400 are held constant. By doing so, common arrival times and signal slews are applied at all register components during tuning, preventing the occurrence of errors arising from early or late signal arrival times for functional signals.

The process then proceeds from block 510 to block 515, which depicts transistor tuning tool 148 optimizing the sizes of the transistors forming registers 220 based on known loading rules and standard design libraries. As shown in FIG. 3B, such optimization can lead to the reduction in size of the transistors forming one or more of bits A-H of register 330. At block 520, transistor tuning tool 148 thereafter optimizes the transistors forming the plurality of clock buffers within the design of integrated circuit 200, including M-1 stage clock buffer 310, $M^{th}$ stage clock buffers 315a, 315b, and LCB 325 utilizing known loading rules based upon newly-optimized registers 220. Finally, the transistor tuning process implemented by transistor tuning tool 148 terminates at block 525 and the attributes of reference clock signal 206 are no longer held constant within the design of integrated circuit 200.

Figure 6:
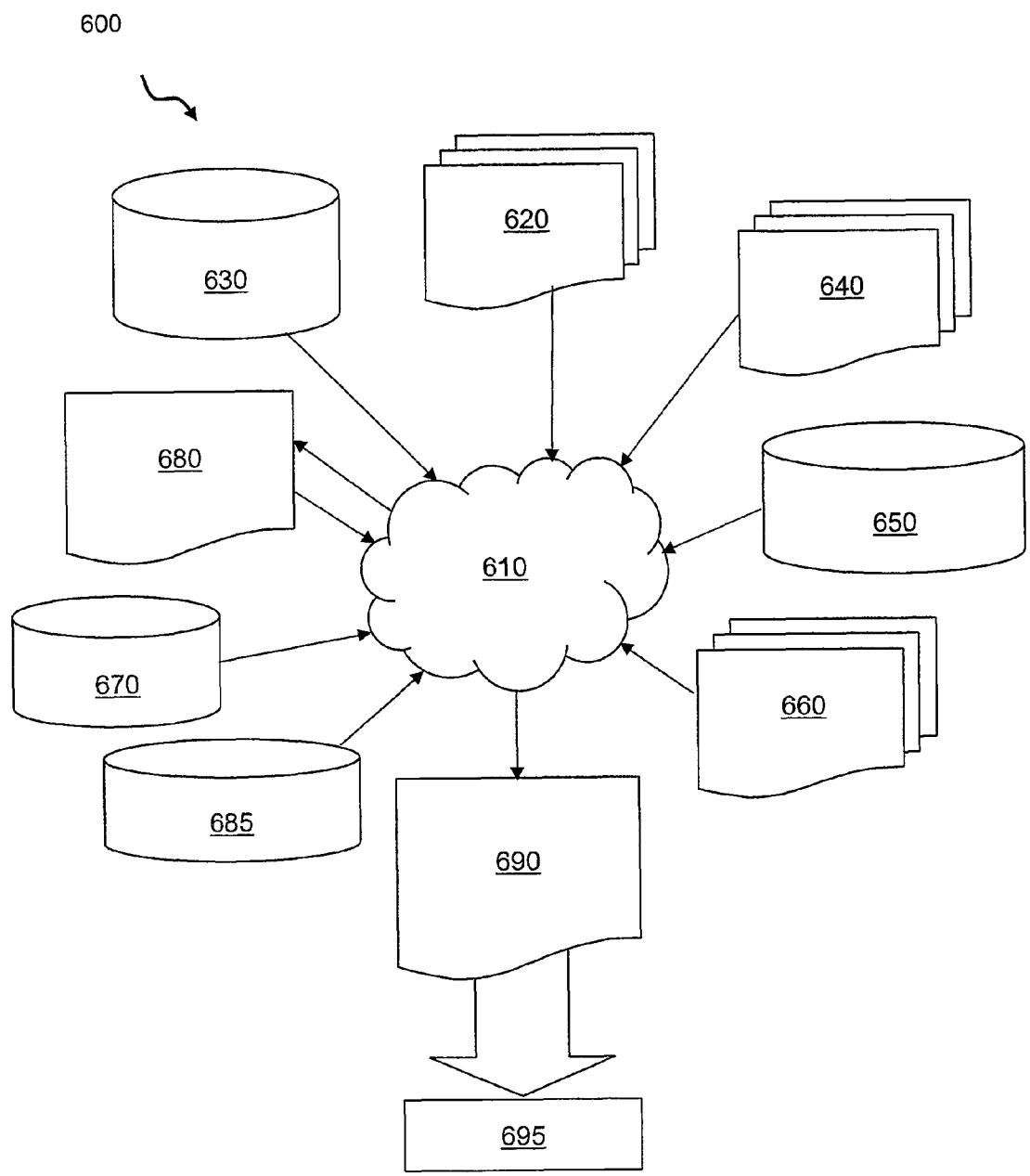
FIG. 6 is a flow diagram of a design process used in semiconductor design, manufacture, and/or test.

FIG. 6 shows a block diagram of an exemplary design flow 600 used for example, in semiconductor IC logic design, simulation, test, layout, and manufacture. Design flow 600 includes processes and mechanisms for processing design structures to generate logically or otherwise functionally equivalent representations of the embodiments of the integrated circuit shown in FIG. 2. The design structures processed and/or generated by design flow 600 may be encoded on machine-readable transmission or storage media to include data and/or instructions that when executed or otherwise processed on a data processing system generate a logically, structurally, or otherwise functionally equivalent representation of hardware components, circuits, devices, or systems.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission or storage medium, design structure 620 may be accessed and processed by one or more hardware and/or software modules within design process 610 to simulate or otherwise functionally represent an electronic component, circuit, electronic or logic module, apparatus, device, or system such as those shown in FIG. 2. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIG. 2 to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium. The medium may be a non-volatile storage medium such as a magnetic or optical disk drive, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include modules for performing standard circuit design processes such as timing analysis, verification, design rule checking, place and route operations, etc.

Design process 610 employs and incorporates well-known logic and physical design tools such as HDL compilers and simulation model build tools to process design structure 620 together with some or all of the depicted supporting data structures to generate a second design structure 690. Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2. In one embodiment, design structure 690 may comprise a compiled, executable HDL simulation model that functionally simulates the devices shown in FIG. 2.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data processed by semiconductor manufacturing tools to fabricate embodiments of the invention as shown in FIG. 2. Design structure 690 may then proceed to a stage 695 where, for example, design structure 690: proceeds to tape-out, is released to manufacturing, is released to a mask house, is sent to another design house, is sent back to the customer, etc.

As has been described, the present invention provides a method, data processing system and program product for automated transistor tuning in an integrated circuit design. According to the present invention, a predetermined reference clock waveform is selected to ensure common data arrival times and signal slews at all register components during tuning. In order to create conditions amenable to the tuning of register components, pattern matching and/or name recognition are employed to hold local clock signatures constant. The individual register bits can then be selected from a standard library to optimize the size of each register bit, such that power efficiency is increased. Once register tuning is complete, the output loads of the local clock buffers (LCBs) may subsequently be optimized to complement the power, area, and timing of the newly optimized registers.

While the invention has been particularly shown and described with reference to a preferred embodiment, it will be understood by those skilled in the art that various changes in form and detail may be made therein without departing from the spirit and scope of the invention. For example, while an illustrative embodiment of the present invention has been described in the context of a fully functional computer system with installed software, those skilled in the art will appreciate that the aspects of an illustrative embodiment of the present invention are capable of being distributed as program code or a design structure (either of which may include instructions, commands, scripts and/or data without limitation) embodied in a machine readable or signal bearing medium having any of a variety of forms, and that the present invention applies equally regardless of the particular type of medium. Examples of computer readable or signal bearing media include storage type media such as thumb drives, floppy disks, hard drives, CD ROMs, DVDs, and transmission type media such as digital and analog communication links. Program code embodied in a machine readable medium can constitute means for performing various functions or logic that performs the various functions.

What is claimed is:

1. A design structure in a data format embodied in a machine-readable storage device, wherein the design structure is for designing, manufacturing, or testing an integrated circuit design, the design structure comprising:
   logic that, when processed by a computer, holds characteristics of a reference clock signal constant across the integrated circuit design, wherein said logic that holds characteristics of the reference clock constant comprises logic that holds a rise time, fall time, rising edge slew rate and falling edge slew rate of the reference clock signal constant; and
   logic that, when processed by the computer and while characteristics of the reference clock signal are held constant:
      optimizes sizes of transistors forming a multi-bit register within the integrated circuit design, wherein the register is coupled to receive and buffer functional data from logic in the integrated circuit design in response to a local clock signal, and wherein optimizing sizes of transistors forming the multi-bit register includes individually optimizing each bit within the register, such that corresponding transistors implementing at least two bits within the register are differently sized between the at least two bits; and
      thereafter, optimizes sizes of transistors forming one or more clock buffers coupled to said reference clock signal, wherein the one or more clock buffers are coupled to provide the local clock signal to the register.

2. The design structure of claim 1, and further comprising:
   logic that, when processed by a computer, optimizes transistor sizes within a logic circuit of the integrated circuit design prior to the holding of characteristics of the reference clock signal constant.

3. The design structure of claim 1, and further comprising the integrated circuit design.

4. A design structure in a data format embodied in a machine-readable storage device, wherein the design structure is for designing, manufacturing, or testing an integrated circuit, the design structure includes data that, when processed by a computer, comprises:
   means for holding characteristics of a reference clock signal constant across the integrated circuit design, wherein said means for holding characteristics of the reference clock constant comprises means for holding a rise time, fall time, rising edge slew rate and falling edge slew rate of the reference clock signal constant; and
   means, while the characteristics of the reference clock signal are held constant, for:
      optimizing sizes of transistors forming a multi-bit register within the integrated circuit design, wherein the register is coupled to receive and buffer functional data from logic in the integrated circuit design in response to a local clock signal, and wherein optimizing sizes of transistors forming the multi-bit register includes individually optimizing each bit within the register, such that corresponding transistors implementing at least two bits within the register are differently sized between the at least two bits; and
      thereafter, optimizing sizes of transistors forming one or more clock buffers coupled to said reference clock signal wherein the one or more clock buffers are coupled to provide the local clock signal to the register.

5. The design structure of claim 4, and further comprising:
   means for, prior to holding characteristics of the reference clock signal constant, optimizing transistor sizes within a logic circuit of the integrated circuit.

6. A design structure in a data format embodied in a machine-readable storage device, wherein the design structure is for designing, manufacturing, or testing an integrated circuit, the design structure comprising:
   an integrated circuit design including:
      a reference clock signal;
      a first element processed to generate a functional computer-simulated representation of a register formed of multiple transistors; and
      a second element processed to generate a functional computer-simulated representation of one or more clock buffers coupled to the reference clock signal;
   logic that, when processed by a computer, holds characteristics of the reference clock signal constant across the integrated circuit design, wherein said logic that holds characteristics of the reference clock constant comprises logic that holds a rise time, fall time, rising edge slew rate and falling edge slew rate of the reference clock signal constant; and logic that, when processed by the computer and while the characteristics of reference clock signal are held constant:

optimizes sizes of transistors forming the multi-bit register within the integrated circuit design, wherein the register is coupled to receive and buffer functional data from logic in the integrated circuit design in response to a local clock signal, and wherein optimizing sizes of transistors forming the multi-bit register includes individually optimizing each bit within the register, such that corresponding transistors implementing at least two bits within the register are differently sized between the at least two bits; and thereafter, optimizes sizes of transistors forming the one or more clock buffers coupled to said reference clock signal, wherein the one or more clock buffers are coupled to provide the local clock signal to the register.

7. The design structure of claim 6, and further comprising:
logic that, when processed by a computer, optimizes transistor sizes within a logic circuit of the integrated circuit design prior to the holding of characteristics of the reference clock signal constant.

8. The design structure of claim 6, wherein the design structure comprises a netlist.

9. The design structure of claim 6, wherein the design structure employs a data format used for the exchange of layout data of integrated circuits.

* * * * *